(12) United States Patent
Morita et al.

(10) Patent No.: US 6,364,731 B1
(45) Date of Patent: Apr. 2, 2002

(54) CIRCUIT DEVICE MANUFACTURING EQUIPMENT

(75) Inventors: Yuki Morita; Kenshi Higuchi, both of Ishikawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/506,631

(22) Filed: Feb. 18, 2000

(30) Foreign Application Priority Data

Feb. 18, 1999 (JP) .............................. 11-38478

(51) Int. Cl.$^7$ .............................................. H01L 21/68
(52) U.S. Cl. ............................ 445/61; 445/24; 438/910
(58) Field of Search ...................... 445/24, 61; 439/910

(56) References Cited

U.S. PATENT DOCUMENTS 5,847,434 A * 12/1998 Onozawa ................... 257/391

FOREIGN PATENT DOCUMENTS

JP         4-137399         5/1992

* cited by examiner

Primary Examiner—Kenneth J. Ramsey
(74) Attorney, Agent, or Firm—Ratner & Prestia, PC

(57) ABSTRACT

An electronic device manufacturing equipment such as for manufacturing liquid crystal display devices containing semiconductor integrated circuits. The equipment includes a protective resistive layer such as with a thickness d ($\mu$m) and a surface resistance of $(55/d)^2 \times (1 \times 10^5$ to $1 \times 10^8)$ ohm/square disposed on a working surface of the equipment between the electronic device and the working surface. In broader terms the present invention is also a method for protecting sensitive electronic components of electronic devices during manufacturing from damage due to electrostatic charges by placing a resistive layer having a thickness d ($\mu$m) and a surface resistance of $(55/d)^2 \times (1 \times 10^5$ to $1 \times 10^8)$ ohm/square between the equipment surface and the electronic device.

17 Claims, 2 Drawing Sheets

CIRCUIT DEVICE MANUFACTURING EQUIPMENT

FIELD OF THE INVENTION

The present invention relates to the field of manufacturing equipment for manufacturing liquid crystal display devices containing semiconductor integrated circuits and more particularly to apparatus and associated method for protecting semiconductor devices from damage due to static electricity.

BACKGROUND OF THE INVENTION

Recent advances in electronic technology have resulted in accelerating miniaturization and higher resolution in all types of electronic appliances and components. In addition, light weight, portable information handling equipment such as mobile phones and laptop PCs are rapidly gaining in popularity in response to the increasingly information-based nature of the economy. Naturally, miniaturization and higher resolution also result in advances in display devices such as liquid crystal display devices, which are used extensively as displays for mobile devices, and the semiconductor integrated circuits which act as driving circuits for liquid crystal display devices.

The miniaturized circuits created by ever finer configuration of semiconductor integrated circuits are extremely fragile, and are increasingly likely to be damaged by static electricity built up during their manufacturing process and subsequent handling. Accordingly, there is an urgent need to develop anti-electrostatic measures to protect electronic devices containing semiconductor integrated circuits, including liquid crystal display devices.

A wide range of measures is already in place to prevent electrostatic damage to electronic devices containing semiconductor integrated circuits during their manufacturing process. One is to dispose a highly conductive metal on the surface of the manufacturing equipment and to use it to provide grounding. To prevent electrostatic charge from accumulating on factory operators, they normally wear an anti-static wristband which is always grounded, and manufacturing jigs and tools are made of materials which minimize the accumulation of electrostatic charge.

FIG. 3 shows a part of the conventional configuration of manufacturing equipment for liquid crystal display devices containing semiconductor integrated circuits. A liquid crystal panel 2, in which a semiconductor integrated circuit for driving the liquid crystal panel 4 is disposed on its wiring pattern terminal 3, is placed on the top working surface of the manufacturing equipment body 1. A discharge current limiting protective resistance 5 is inserted between the manufacturing equipment body 1 and ground 6.

As shown in FIG. 3, any electrostatic charge generated at the wiring pattern terminal 3 of the liquid crystal panel 2 is instantaneously discharged to the metal face of the manufacturing equipment body 1 which is located under the wiring pattern terminal 3. This, usually, causes electrostatic damage to the semiconductor integrated circuit used for driving the liquid crystal panel 4. A circuit device damaged by an electrostatic discharge may still appear to operate properly by barely switching ON and OFF if it is part of a digital signal processing circuit. However, its reliability has decreased. If the damaged integrated circuit is part of an analog signal processing circuit, such as an operational amplifier for determining the contrast of the liquid crystal display, such damage may directly degrade the display quality, causing a defective product in many cases.

To prevent this type of defect, the manufacturing equipment body 1 according to the prior art is connected to ground 6 via a discharge current limiting protective resistance 5. This limits the current passing through the discharge path to the ground 6 from the wiring pattern terminal 3 through the metal working surface of the manufacturing equipment body 1, thus enabling the gradual discharge of electrostatic charge.

In the conventional manufacturing equipment for liquid crystal display devices, the flow of electric current from the manufacturing equipment to the ground may be limited, but the surface of the manufacturing equipment has high conductivity and is a relatively very large metal surface. Viewed from the wiring pattern terminal 3, the large metal surface area of the manufacturing equipment appears effectively as a ground plane as it allows the accumulated electrostatic charge to spread very easily and therefore act as if it were grounded. Accordingly, electrostatic charge accumulated on the wiring pattern terminal 3 during the actual manufacturing process of liquid crystal display devices may be substantially instantaneously discharged to the metal surface of the manufacturing equipment, even when a current limiting resistance is used to ground the equipment, causing a problem of electrostatic breakdown.

The present invention solves this problem and aims to offer circuit device manufacturing equipment which prevents electrostatic damage of devices typically containing a semiconductor integrated circuit subject to damage due to electrostatic charge accumulation and/or discharge.

SUMMARY OF THE INVENTION

According to this invention there is provided manufacturing equipment for use in manufacturing electronic devices comprising circuits subject to damage from electrostatic charges, the equipment comprising a grounded conductive surface in close proximity to said electronic devices, the improvement comprising a protective resistive (dielectric) layer over said conductive surface, said protective layer having a thickness d ($\mu$m) and a surface resistance of about $(55/d)^2 \times (1\times10^5$ to $1\times10^8)$ ohm/square said protective layer located at least between said electronic device when said electronic device is disposed on said equipment and said equipment.

The circuit device manufacturing equipment of the present invention has a protective resistance layer with thickness of d ($\mu$m) and a surface resistance value of $(55/d)^2 \times (1\times10^5$ to $1\times10^8)$ ohm/square, which is placed between a rear face of a wiring pattern terminal of the circuit device placed on the manufacturing equipment and a surface of the manufacturing equipment facing the above rear face of the wiring pattern terminal.

The invention may also be practiced by a method for manufacturing electronic components wherein damage due to electrostatic charges during mounting of an integrated electronic circuit comprising semiconductor components on an electronic device wherein the device is positioned on an electrically grounded conductive working surface of a manufacturing equipment is prevented. According to the present invention, damage is prevented by placing a protective resistive layer having a thickness d in $\mu$m, and a surface resistance of about $(55/d)^2 \times (1\times10^5$ to $1\times10^8)$ ohm/square between said electronic device and said conductive working surface.

Provision of the protective resistance layer prevents easy spread of static electricity on the surface of the manufacturing equipment, and also prevents the surface of manufacturing equipment to have the state of as if it were grounded. As a result, a discharge current from the circuit device to the surface of manufacturing equipment may be limited during the manufacture of circuit devices, enabling the prevention of an electrostatic breakdown of circuit devices.

Figure 1:
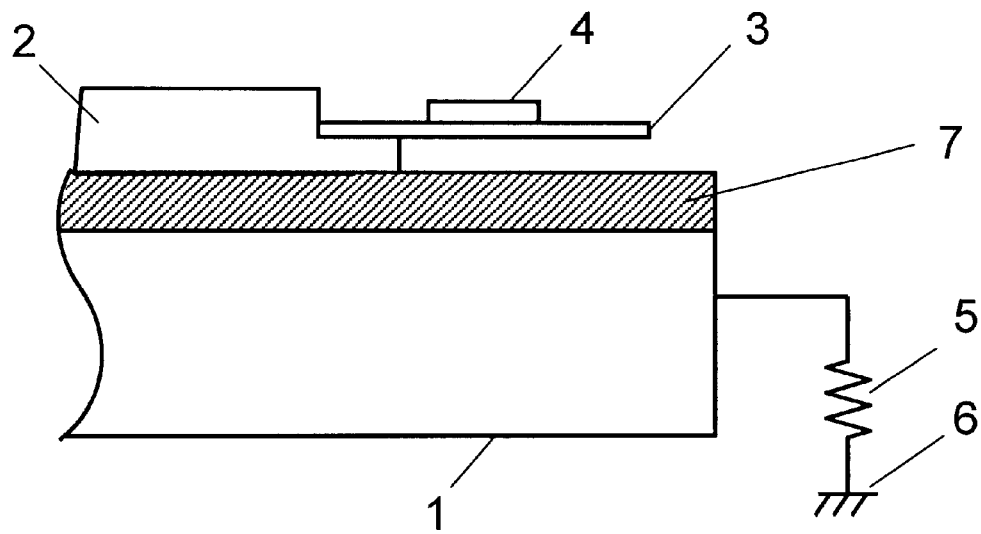
FIG. 1 is a schematic elevation of a partial view of the configuration of manufacturing equipment for liquid crystal display devices in a preferred embodiment of the present invention.

Reference Numerals 1 manufacturing equipment body
2 liquid crystal panel
3 wiring pattern terminal
4 semiconductor integrated circuit for driving liquid crystal panel
5 discharge current limiting protective resistance
6 ground
7 protective resistance layer

DETAILED DESCRIPTION OF THE INVENTION

A preferred embodiment of the present invention is described with reference to drawings in which the same reference numerals are used to designate the same parts in all figures.

FIG. 1 is a schematic elevation of a partial view of manufacturing equipment for liquid crystal display devices containing a semiconductor integrated circuit in accordance with a preferred embodiment of the present invention. A liquid crystal panel 2 is shown disposed on the top, or working surface of a piece of manufacturing equipment 1. The surface is a metal surface covered with a protective resistive layer 7. The liquid crystal panel 2 includes a wiring pattern terminal 3. A semiconductor integrated circuit 4 for driving the liquid crystal panel 2 is also shown on the wiring pattern terminal 3 of the liquid crystal panel 2. A discharge current limiting protective resistance 5 is interposed between the manufacturing equipment body 1 and ground 6.

The protective resistive layer 7 is a layer which has a surface resistance (or sheet resistance) value of from about $1 \times 10^5$ to about $1 \times 10^8$ ohm/square and a typical thickness of about 55 μm. Preferably this layer is disposed on the work surface of the manufacturing equipment body 1 facing the rear face of the wiring pattern terminal 3. The protective layer 7 may be provided on the surface of the manufacturing equipment body 1 using a method such as pasting and coating.

This type of manufacturing equipment is widely used for supporting the liquid crystal panel during a range of processes required to manufacture liquid crystal display devices, such as forming a protective resin on the terminal portion of the liquid crystal panel on which semiconductor integrated circuits are mounted, cleaning of the liquid crystal panels, and pasting an optical film onto the surface of liquid crystal panels.

Figure 4:
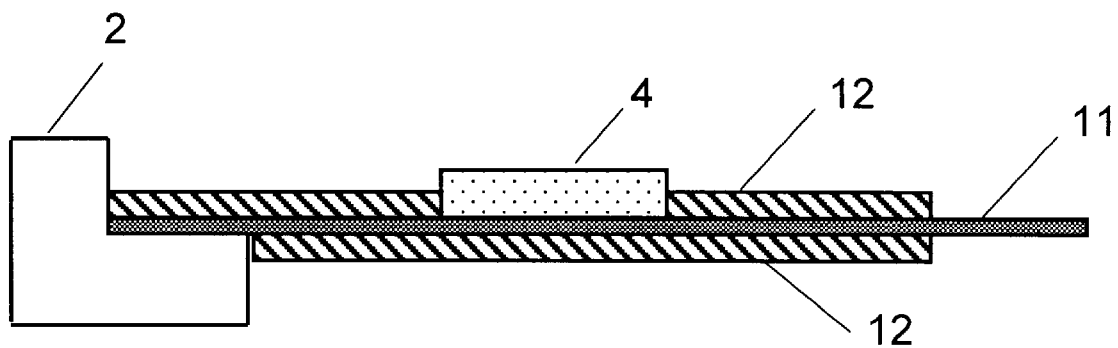
FIG. 4 is a schematic elevation of a partial view of the configuration of wiring pattern terminal of liquid crystal display devices in a preferred embodiment of the present invention.

The wiring pattern terminal 3 comprises a patterned copper foil 11 sandwiched between two polyimide films 12 and 12', and a semiconductor integrated circuit 4, as shown in FIG. 4. This configuration is called TCP (Tape Carrier Package). A portion of the patterned copper foil 11 where it is to be connected to external circuit (right hand side) is not covered with polyimide film. This exposed conductive copper foil presents an easy path for an electrostatic charge discharge to the working surface of the manufacturing equipment body 1.

In the conventional manufacturing process for liquid crystal display devices, electrostatic charge that has built up on the wiring pattern terminal 3 of the liquid crystal panel 2 is instantaneously discharged to the surface of the manufacturing equipment body 1. In such case, excessive current flows during the discharge due to the low resistance of the surface of the manufacturing equipment body 1 even in the presence of the limiting resistance 5, as mentioned earlier. If, in order to remedy this problem there is placed an insulating layer between the terminal 3 and the working surface 9 of the manufacturing equipment body 1, the intervening resistance is greatly increased and as result, electrostatic charge accumulates on the surface of the manufacturing equipment body 1 instead of discharging to ground. This also has a detrimental effect. Accordingly, in the manufacturing equipment according to this invention, in addition to the discharge current limiting protective resistance 5 between the manufacturing equipment body 1 and the ground 6 which limits the level of current flow between these two parts, there is provided a protective layer 7 such as a resistive sheet or a resistive tape on the surface of the manufacturing equipment body 1. By a proper selection of the resistivity of the resistive layer forming the protective layer 7, one can suppress rapid discharges and high-current discharges between the wiring pattern terminal 3 of the liquid crystal panel 2 and the surface of the manufacturing equipment body 1, and still provide for gradual leakage of any electrostatic charge build up.

According to this invention, the protective resistive layer surface resistance is maintained above about $1 \times 10^5$ ohm/square and under about $1 \times 10^8$ ohm/square. If the surface resistance of the protective layer 7 is lower than $1 \times 10^5$ ohm/square, the semiconductor integrated circuit 4 may be damaged because an electrostatic discharge current is large. If the surface resistance of the protective resistance layer 7 is higher than $1 \times 10^8$ ohm/square, the electrostatic charge is apt to accumulate on the surface of the protective resistance layer 7 and the prevention of electrostatic damage to the semiconductor integrated circuit 4 may also become insufficient.

Thus electrostatic damage to the semiconductor integrated circuit 4 for driving liquid crystal panels is preventable by releasing gradually the electrostatic charge built up on the wiring pattern terminal 3 through the protective layer 7, while limiting the discharge current level to avoid the abrupt discharge between the wiring pattern terminal 3 and the manufacturing equipment body 1. Consequently, liquid crystal panels with high reliability and high quality can be produced with high production yield.

Up to here, the desirable condition of the protective resistance layer 7 was expressed by reference to surface resistance range. However, the above protection effect is essentially determined by the value of the series resistance inserted between the wiring pattern terminal 3 and the manufacturing equipment body 1. In this point, we must consider the resistance measured normal to the surface of the protective resistance layer 7. If we designate the thickness, the sheet resistance and an arbitrary area of the protective layer 7 to be $d_o$, $R_{so}$ and S respectively, the resistance Ro normal to the surface of the resistive layer 7 is expressed as $Ro=R_{so} \times d_o^2/S$. The desired protection effect is maintained as long as the resistance normal to the surface of layer 7 is kept the same when protective layers of different thickness and sheet resistance values are used. When the thickness and the sheet resistance value of the resistance layer 7 are generally expressed as d and $R_s$ respectively, the series resistance is expressed as $R=R_s \times d^2/S$. Setting R=Ro, we obtain the relation $R_s=(d_o/d)^2 \times R_{so}$. Accordingly, the condition, that the surface resistance is $1 \times 10^5 - 1 \times 10^8$ ohm/square when the thickness is 55 um, is generalized for any arbitrary thickness d ($\mu$m) as $(55/d)^2 \times (1 \times 10^5$ to $1 \times 10^8)$ ohm/square.

The circuit device manufacturing equipment has been described up to this point as being one used in the manufacturing processes of liquid crystal panels after semiconductor integrated circuits are mounted on the panels. However, it is apparent that the present invention is also effective in processes for the actual mounting of the semiconductor integrated circuits onto the liquid crystal panels.

Figure 2:
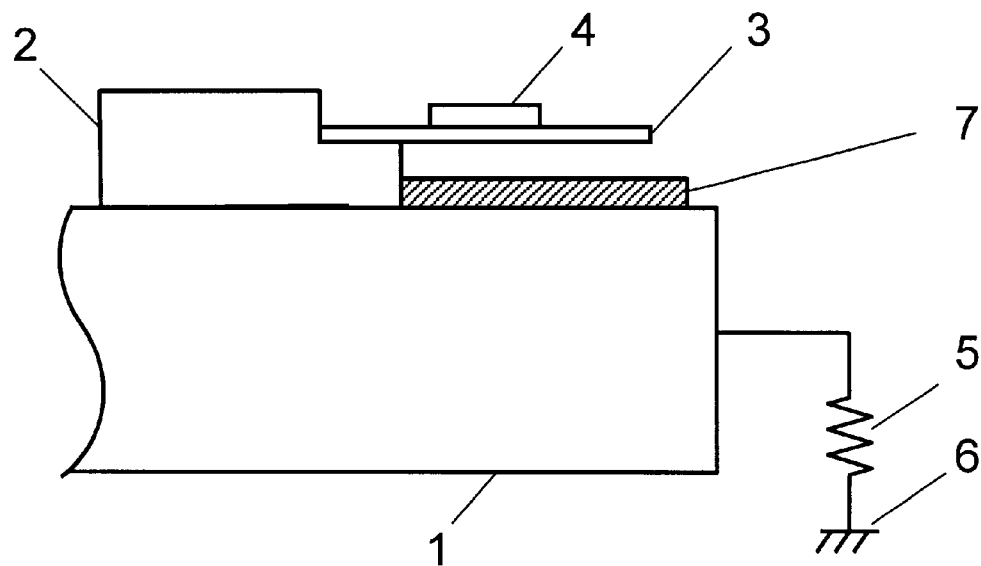
FIG. 2 is a schematic elevation of a partial view of the configuration of another example of the manufacturing equipment for liquid crystal display devices in the preferred embodiment of the present invention.
Figure 3:
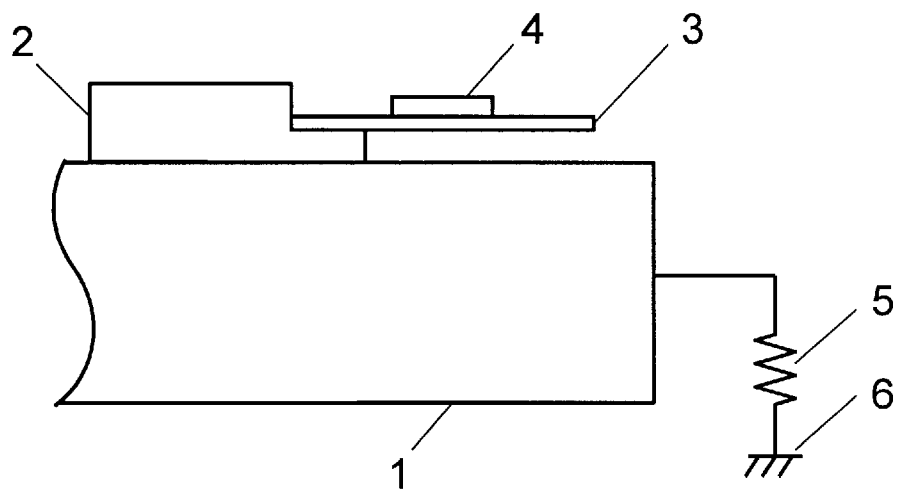
FIG. 3 is a schematic elevation of a partial view of the configuration of conventional manufacturing equipment for liquid crystal display devices.

The examples also describe the case of providing a fixed protective layer 7 with a surface resistance value of $(55/d)^2 \times (1 \times 10^5$ to $1 \times 10^8)$ ohm/square on the surface of the manufacturing equipment body 1. The same effect is obtained by interposing this protective resistance layer 7' between the wiring pattern terminal of the circuit device and the manufacturing equipment as a detachable layer, as shown in FIG. 2. This layer may be in the form of a self supporting layer having an adhesive on one side thereof for attachment to a conductive working area under the electronic device to be protected.

The preferred embodiment also describes the case of a liquid crystal display device as an electronic circuit device containing semiconductor integrated circuits. The same effect is also achievable for manufacturing equipment for circuit devices containing semiconductor integrated circuits other than a liquid crystal devices.

As described above, the electronic device manufacturing equipment of the present invention prevents sudden discharge which is caused by the accumulation of the electrostatic charge at the wiring pattern terminal in the circuit device, and prevents the electrostatic damage in the electronic device which is placed on the manufacturing equipment.

This invention is also a method for preventing damage due to electrostatic charges during mounting of an integrated electronic circuit comprising semiconductor components on an electronic device. During such mounting and in general other handling of sensitive devices by manufacturing equipment, the device is usually positioned on an electrically grounded conductive working surface of the manufacturing equipment. In accordance with the present invention, a protective resistive layer having a thickness d in $\mu$m, and a surface resistance of about $(55/d)^2 \times (1 \times 10^5$ to $1 \times 10^8)$ ohm/square is placed between the electronic device and the conductive working surface before the device is placed on the equipment surface.

This method has been particularly useful when the electronic device comprises a liquid crystal as in the case of a liquid crystal display panel that includes a wiring pattern terminal for mounting integrated circuits. In such cases the protective layer is placed under the wiring pattern terminal on the working surface before, or contemporaneously with the electronic device placed on the working surface.

Those having the benefit of the above description of my invention will recognize numerous variations including the use of this technique in all instances where sensitive electronic devices that are subject to damage due to electrostatic charge accumulation or discharge must be handled adjacent a large, grounded conductive mass, regardless of the nature of the electronic device and the conductive mass. Such variations are to be construed as being within the scope of my invention in which what is claimed is:

What is claim is:

1. Manufacturing equipment for use in manufacturing electronic devices comprising circuits subject to damage from electrostatic charges, the equipment comprising a grounded conductive surface in close proximity to said electronic devices, the improvement comprising a protective resistive layer over said conductive surface, said protective layer having a thickness d ($\mu$m) and a surface resistance of about $(55/d)^2 \times (1 \times 10^5$ to $1 \times 10^8)$ ohm/square said protective layer located at least between said electronic device when said electronic device is disposed on said equipment and said equipment.

2. The manufacturing equipment according to claim 1 wherein said manufacturing equipment comprises a conductive working surface on which said electronic devices are placed and wherein said protective layer is fixed to said working surface and covers said conductive working surface.

3. The manufacturing equipment according to claim 2 wherein said protective layer is detachably attached to said working surface.

4. The manufacturing equipment according to claim 1 wherein said conductive working surface is connected to ground through a current limiting resistance.

5. Manufacturing equipment for manufacturing electronic components comprising semiconductor integrated circuits subject to damage from electrostatic charges, the equipment comprising a working surface on which an electronic device having a wiring pattern terminal is placed to be worked on, said working surface comprising a conductive surface and over said conductive surface a protective resistive layer with thickness d in $\mu$m, and with a surface resistance of $(55/d)^2 \times (1 \times 10^5$ to $1 \times 10^8)$ ohm/square said protective layer being disposed at least between said wiring pattern terminal and said conductive working surface .

6. The manufacturing equipment as defined in claim 5, wherein said protective layer with thickness of d ($\mu$m) and surface resistance of $(55/d)^2 \times (1 \times 10^5$ to $1 \times 10^8)$ ohm/square is fixed on the conductive working surface of the manufacturing equipment.

7. The circuit device manufacturing equipment as defined in claim 5, wherein said manufacturing equipment comprises a main body made of a conductive material and a surface made of a resistive layer having a surface resistance of $(55/d)^2 \times (1 \times 10^5$ to $1 \times 10^8)$ ohm/square and thickness of d ($\mu$m).

8. The circuit device manufacturing equipment as defined in claim 5, wherein said protective resistive layer is detachable.

9. The circuit device manufacturing equipment as defined in claim 5, wherein said manufacturing equipment is connected to an electrical ground through a current limiting resistance.

10. The circuit device manufacturing equipment as defined in claim 5, wherein said working surface is adapted to support said wiring pattern terminal during the mounting of a semiconductor integrated circuit onto said wiring pattern terminal.

11. The manufacturing equipment as defined in claim 5, wherein a semiconductor integrated circuit is mounted on said wiring pattern terminal of said electronic device.

12. The manufacturing equipment as defined in claim 5, wherein said electronic device is a liquid crystal display device.

13. A method for preventing damage due to electrostatic charges during mounting of an integrated electronic circuit comprising semiconductor components on an electronic device wherein the device is positioned on an electrically grounded conductive working surface of a manufacturing equipment, the method comprising placing a protective resistive layer having a thickness d in μm, and a surface resistance of about $(55/d)^2 \times (1 \times 10^5$ to $1 \times 10^8)$ ohm/square between said electronic device and said conductive working surface.

14. The method according to claim 13 further comprising having said resistive layer permanently fixed on said surface prior to placing said electronic device on said working surface.

15. The method according to claim 13 further comprising placing said electronic device on said protective surface and in contact therewith prior to mounting said integrated circuit thereon.

16. The method according to claim 13 wherein said electronic device comprises a liquid crystal.

17. The method according to claim 16 wherein said electronic device includes a wiring pattern terminal for mounting said integrated circuit and wherein said protective layer is placed under said wiring pattern terminal.

* * * * *

UNITED STATES PATENT AND TRADEMARK OFFICE
CERTIFICATE OF CORRECTION

PATENT NO.    : 6,364,731 B1
DATED         : April 2, 2002
INVENTOR(S)   : Yuki Morita et al.

It is certified that error appears in the above-identified patent and that said Letters Patent is hereby corrected as shown below:

Title page,
Item [30], Foreign Application Priority Data, delete "11-38478", and insert -- 11-39478 --.

Signed and Sealed this

Eleventh Day of February, 2003

JAMES E. ROGAN
*Director of the United States Patent and Trademark Office*